US011549043B2

(12) United States Patent
Ota et al.

(10) Patent No.: US 11,549,043 B2
(45) Date of Patent: Jan. 10, 2023

(54) MULTICOMPONENT-CURABLE THERMALLY-CONDUCTIVE SILICONE GEL COMPOSITION, THERMALLY-CONDUCTIVE MEMBER AND HEAT DISSIPATION STRUCTURE

(71) Applicant: DOW TORAY CO., LTD., Tokyo (JP)

(72) Inventors: Kenji Ota, Ichihara (JP); Toyohiko Fujisawa, Ichihara (JP)

(73) Assignee: DOW TORAY CO., LTD., Tokyo (JP)

( * ) Notice: Subject to any disclaimer, the term of this patent is extended or adjusted under 35 U.S.C. 154(b) by 548 days.

(21) Appl. No.: 16/633,436

(22) PCT Filed: Jul. 11, 2018

(86) PCT No.: PCT/JP2018/026231
§ 371 (c)(1),
(2) Date: Apr. 9, 2020

(87) PCT Pub. No.: WO2019/021826
PCT Pub. Date: Jan. 31, 2019

(65) Prior Publication Data
US 2020/0270499 A1 Aug. 27, 2020
US 2021/0261844 A9 Aug. 26, 2021

(30) Foreign Application Priority Data

Jul. 24, 2017 (JP) .............................. JP2017-142707

(51) Int. Cl.
*C09K 5/14* (2006.01)
*H01M 10/613* (2014.01)
*H01M 10/655* (2014.01)
*C08L 83/04* (2006.01)
*H05K 1/02* (2006.01)

(52) U.S. Cl.
CPC ................ *C09K 5/14* (2013.01); *C08L 83/04* (2013.01); *H01M 10/613* (2015.04); *H01M 10/655* (2015.04); *C08L 2201/08* (2013.01); *C08L 2205/025* (2013.01); *C08L 2205/03* (2013.01); *C08L 2312/08* (2013.01); *H05K 1/0203* (2013.01)

(58) Field of Classification Search
CPC ....................................................... C09K 5/14
See application file for complete search history.

(56) References Cited

U.S. PATENT DOCUMENTS

| 4,604,424 A | 8/1986 | Cole et al. |
| 6,169,142 B1 | 1/2001 | Nakano et al. |
| 2004/0254275 A1 | 12/2004 | Fukui et al. |
| 2008/0139731 A1 | 6/2008 | Lawson et al. |
| 2010/0140538 A1 | 6/2010 | Sekiba |
| 2011/0188213 A1 | 8/2011 | Domae et al. |
| 2011/0311767 A1 | 12/2011 | Elahee |
| 2016/0237332 A1 | 8/2016 | Merrill et al. |
| 2017/0121462 A1 | 5/2017 | Fujisawa et al. |
| 2018/0022977 A1 | 1/2018 | Tsuji |
| 2019/0292349 A1 | 9/2019 | Ito |
| 2020/0239758 A1 | 7/2020 | Ota |
| 2020/0270500 A1 | 8/2020 | Ota |

FOREIGN PATENT DOCUMENTS

| JP | S62-184058 A | 8/1987 |
| JP | H11-209618 A | 8/1999 |
| JP | 2000-001616 A | 1/2000 |
| JP | 2005-162975 A | 6/2005 |
| JP | 2008-239719 A | 10/2008 |
| JP | 2008-546861 A | 12/2008 |
| JP | 2009-286855 A | 12/2009 |
| JP | 2013-124257 A | 6/2013 |
| JP | 2015-119173 A | 6/2015 |
| JP | 2016-151010 A | 8/2016 |
| JP | 2016-219738 A | 12/2016 |
| JP | 2017-039802 A | 2/2017 |
| JP | 2017-043717 A | 3/2017 |
| JP | 2017-210518 A | 11/2017 |
| WO | 2006107003 A1 | 10/2006 |
| WO | 20120102852 A1 | 8/2012 |
| WO | 2015/155950 A1 | 10/2015 |
| WO | 2016/140020 A1 | 9/2016 |

OTHER PUBLICATIONS

International Search Report for PCT/JP2018/026231 dated Oct. 23, 2018, 2 pages.
Machine-assisted English translation of JP H11-209618 obtained from https://worldwide.espacenet.com on Feb. 4, 2020, 16 pages.
Machine-assisted English translation of JP 2005-162975 obtained from https://worldwide.espacenet.com on Feb. 4, 2020, 11 pages.
Machine-assisted English translation of JP 2013-124257 obtained from https://worldwide.espacenet.com on Feb. 4, 2020, 11 pages.
Machine-assisted English translation of JP 2015-119713 obtained from https://worldwide.espacenet.com on Feb. 4, 2020, 31 pages.
Machine-assisted English translation of JP 2016-151010 obtained from https://worldwide.espacenet.com on Feb. 4, 2020, 25 pages.

(Continued)

*Primary Examiner* — Arrie L Reuther
(74) *Attorney, Agent, or Firm* — Warner Norcross + Judd LLP

(57) ABSTRACT

Provided is: a multicomponent curable thermally conductive silicone gel composition which has a high thermal conductivity, has excellent gap-filling ability and repairability, and has superior storage stability; a thermally conductive member comprising the composition; and a heat dissipating structure using the same. The thermally conductive silicone gel composition comprises: (A) an alkenyl group-containing organopolysiloxane; (B) an organohydrogenpolysiloxane; (C) a catalyst for hydrosilylation reaction; (D) a thermally conductive filler; (E) a silane-coupling agent or a hydrolysis condensation product thereof; and (F) a specific organopolysiloxane having a hydrolyzable silyl group at one end thereof. The thermally conductive silicone gel composition includes (I) a liquid composition that includes components (A), (C), (D), (E), and (F), but does not include component (B) and (II) a liquid composition that includes components (B), (D), (E), and (F), but does not include component (C) which are individually stored.

16 Claims, No Drawings

(56) References Cited

OTHER PUBLICATIONS

Machine-assisted English translation of JP 2016-219738 obtained from https://worldwide.espacenet.com on Feb. 4, 2020, 34 pages.
Machine-assisted English translation of JP 2017-039802 obtained from https://worldwide.espacenet.com on Feb. 4, 2020, 45 pages.
Machine-assisted English translation of JP 2017-043717 obtained from https://worldwide.espacenet.com on Feb. 4, 2020, 18 pages.

MULTICOMPONENT-CURABLE THERMALLY-CONDUCTIVE SILICONE GEL COMPOSITION, THERMALLY-CONDUCTIVE MEMBER AND HEAT DISSIPATION STRUCTURE

CROSS-REFERENCE TO RELATED APPLICATIONS

This application is the National Stage of International Appl. No. PCT/JP2018/026231 filed on 11 Jul. 2018, which claims priority to and all advantages of Japanese Appl. No. 2017-142707 filed on 24 Jul. 2017, the content of which is hereby incorporated by reference.

TECHNICAL FIELD

The present invention relates to a thermally conductive silicone gel composition that has high thermal conductivity, that is less likely to experience liquid (composition) separation in packaging for a multicomponent curable composition such as a two-part liquid composition, that can be stored stably, and that has excellent gap-filling ability and repairability with respect to heat-dissipating components; and to a thermally conductive member composed of this composition, and a heat-dissipating structure using this member.

BACKGROUND ART

In recent years, the density and integration of printed circuit boards and hybrid ICs on which electronic components such as transistors, ICs and memory elements are mounted, and the capacity of secondary batteries (cells) have increased significantly. In order to more efficiently dissipate the heat generated by electronic and electrical devices such as these electronic components and batteries, thermally conductive silicone compositions comprising organopolysiloxanes, aluminum oxide powders, and thermally conductive fillers such as zinc oxide powder are increasingly being used. In particular, thermally conductive silicone compositions containing large amounts of thermally conductive fillers have been proposed to address the issue of higher heat dissipation.

For example, thermally conductive silicone compositions with higher thermal conductivity have been realized in Patent Document 1 and Patent Document 2. These documents propose that by treating the surface of a thermally conductive filler with a hydrolyzable silane having a long-chain alkyl group, the increase in the viscosity of these thermally conductive silicone compositions can be reduced despite a higher thermal conductive inorganic filler content to improve moldability, and flexibility and heat-resistant mechanical properties can be imparted to molded products. A thermally conductive silicone composition containing a thermal conductive filler surface-treated with two or more treatment agents with different molecular weights has been proposed in Patent Document 3. This document proposes that by adjusting the timing of addition of these treatment agents, the fluidity of the compound is not impaired despite high thermally conductive filler content.

However, the fluidity of these thermally conductive silicone compositions is still insufficient despite these reductions in viscosity and improvements in moldability. As a result, these compositions cannot be applied with precision to the structures of highly refined electric and electronic materials, and gaps occur with electronic components whose heat is to be dissipated, causing insufficient heat dissipation and latent heat buildup.

A certain type of multi-component curable composition is used as an addition-curable silicone material for electronic materials in which a composition containing an organohydrogenpolysiloxane crosslinking agent and a composition not containing this crosslinking agent are stored and distributed in separate packages to be mixed together when used. Patent Documents 1-3 do not disclose any multi-component curable thermally conductive silicone composition, and there is no known stable multi-component curable thermally conductive silicone composition that contains both an organohydrogenpolysiloxane crosslinking agent and a large amount of thermally conductive filler.

PRIOR ART DOCUMENTS

Patent Documents

Patent Document 1: JP H11-209618 A
Patent Document 2: JP 2000-001616 A
Patent Document 3: JP 2005-162975 A

SUMMARY OF THE INVENTION

Problem to be Solved by the Invention

The present inventors have also discovered a new problem. When an attempt is made to choose a type of multi-component curable composition to improve the storage stability and handling efficiency of a thermally conductive silicone composition, the thermally conductive filler content mentioned above has to be extremely high in the composition for the high heat irradiating region above 2.0 W/mK. Meanwhile, if the viscosities and thermally conductive filler content of the separate compositions constituting a multi-component composition are significantly different, it can be difficult to uniformly mix these compositions together when used. However, when a liquid multicomponent curable composition containing a high thermally conductive filler content and an organohydrogenpolysiloxane cross-linking agent is designed, separation of the thermally conductive filler occurs over time. Therefore, it can be difficult to design a multicomponent curable thermally conductive silicone composition as a stable package. The present inventors also discovered that the surface treatment agents proposed in Patent Documents 1-3 separate from thermally conductive fillers and make long-term storage stability difficult.

It is an object of the present invention to solve this problem by providing a multicomponent curable thermally conductive silicone gel composition that, despite a high thermally conductive inorganic filler content and high thermal conductivity above 2.0 W/mK, remains highly fluid as a composition after mixing, providing excellent precision application properties and gap filling properties for electronic components with many gaps, and that is less likely to experience liquid (composition) separation in packaging for a multicomponent curable composition such as a two-part liquid composition, especially in the composition containing an organohydrogenpolysiloxane crosslinking agent, thus providing long-term storage stability. Because the resulting thermally conductive cured product is a soft gel composition, it can relax stress caused by differences in thermal expansion coefficients between electronic components and heat-dissipating structures and prevent damage to components. It is also an object of the present invention to provide a thermally conductive member using this thermally conductive silicone gel composition, and a heat-dissipating structure using this member.

Means for Solving the Problem

As a result of extensive research, the present inventors discovered that the problem could be solved by a multicomponent curable thermally conductive silicone gel composition comprising a large amount of thermally conductive filler to impart high thermal conductivity, a surface treatment agent for the thermally conductive filler, (E) one or more silane coupling agents or hydrolyzed condensates thereof, and (F) an organopolysiloxane having a hydrolyzable silyl group at one end of the molecular chain, designed so that the sum of component (E) and component (F) in liquid (II) containing the organohydrogenpolysiloxane crosslinking agent to the sum of component (E) and component (F) in liquid (I) containing the alkenyl group-containing organopolysiloxane main agent is greater, that is, has a mass ratio in a range from 1.5 to 10.0. The present invention is a product of this discovery. They also discovered that the problem can be advantageously solved by a multicomponent curable thermally conductive silicone gel composition in which the amount of component (F) in liquid (II) is higher than the amount of component (F) in liquid (I). The present invention is also a product of this discovery.

Specifically, the object of the present invention is achieved by a multicomponent curable thermally conductive silicone gel composition comprising:

(A) an alkenyl group-containing organopolysiloxane having a viscosity at 25° C. of 10 to 100,000 mPa·s in an amount of 100 parts by mass;

(B) an organohydrogenpolysiloxane in an amount such that the silicon-bonded hydrogen atoms in component (B) are from 0.2 to 5 mol per mol of alkenyl groups in component (A);

(C) a hydrosilylation reaction catalyst in a catalytic amount;

(D) a thermally conductive filler;

(E) one or more silane coupling agents or hydrolyzed condensates thereof; and (F) an organopolysiloxane having a hydrolyzable silyl group at one end of the molecular chain; wherein at least liquids (I) and (II) below are stored separately, Liquid (I): A composition containing components (A), (C), (D), (E) and (F), but not component (B), and Liquid (II): A composition containing components (B), (D), (E) and (F), but not component (C); and wherein (I) the amount of component (D) in the liquid is from 600 to 3,500 parts by mass, (II) the amount of component (D) in the liquid is from 600 to 3,500 parts by mass, and the mass ratio of the sum of component (E) and component (F) in liquid (II) to the sum of component (E) and component (F) in liquid (I) is in a range from 1.5 to 10.0. In this composition, preferably, the total amount of component (E) and component (F) is 0.1 to 5.0% by mass and the mass ratio of component (E) to component (F) is in a range from 5:95 to 95:5 when the total mass of component (D) in the composition is 100% by mass. In this composition, preferably, the amount of component (D) in liquids (I) and (II) is in a range from 85 to 98% by mass relative to the composition as a whole, and the composition is substantially free of fillers other than component (D). This composition preferably has thermal conductivity of at least 2.0 W/mK, preferably of at least 3.5 W/mK, and more preferably of at least 4.0 W/mK.

The object of the present invention can be achieved when component (E) contains (E1) an alkoxysilane having an alkyl group with 6 or more carbon atoms in the molecule, and component (D) is surface-treated with component (E) and component (F). The surface treatment with component (E) and component (F) is surface treatment by heating. More preferably, component (E1) is a trialkoxysilane having an alkyl group with 6 to 18 carbon atoms. Surface treatment of component (D) with component (E) and component (F) in liquid (I) and liquid (II) is preferably performed by surface treating component (D) primarily with component (E) and then surface treating component (D) primarily with component (F).

Preferably, in the case of component (F), the present invention is a multicomponent curable thermally conductive silicone gel composition according to any one of claims 1 to 4, wherein component (F) is an organopolysiloxane represented by general formula (1) or general formula (2) below or a mixture of these.

(i) Organopolysiloxanes having a viscosity at 25° C. of from 10 to less than 10,000 mPa·s represented by general formula (1):

[Formula 1]

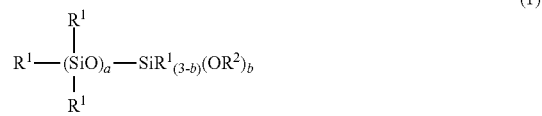

(In this formula, $R^1$ represents an unsubstituted or substituted monovalent hydrocarbon group, each $R^2$ independently represents a hydrogen atom, an alkyl group, an alkoxyalkyl group, or an acyl group, a is an integer from 5 to 250, and b is an integer from 1 to 3.)

(ii) Organopolysiloxanes represented by general formula (2):

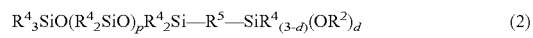

(In this formula, $R^4$ represents the same or different monovalent hydrocarbon group, $R^5$ is an oxygen atom or a divalent hydrocarbon group, $R^2$ is the same as above, p is an integer from 100 to 500, and d is the same as above.)

The object of the present invention is preferably achieved by a multicomponent curable thermally conductive silicone gel composition, wherein component (B1) in component (B) has a viscosity at 25° C. of from 1 to 1,000 mPa·s and contains an average of 2 to 4 silicon-bonded hydrogen atoms per molecule, some being linear organohydrogenpolysiloxanes having at least 2 such atoms on a side chain of the molecular chain, and a relationship is established between the silicon-bonded hydrogen atoms $[H_{B1}]$ in component (B1) of the composition and the silicon-bonded hydrogen atoms in organohydrogenpolysiloxanes other than component (B1) $[H_{non-B1}]$ such that the value of $[H_{non-B1}]/([H_{B1}]+[H_{non-B1}])$ is in a range of from 0.0 to 0.70. The same value may be 0.0 to 0.50, 0.0 to 0.25, or 0.0.

The object of the present invention is preferably achieved by a multicomponent curable thermally conductive silicone gel composition further comprising (G) a heat resistance-imparting agent.

The object of the present invention is preferably achieved by a multicomponent curable thermally conductive silicone gel composition, wherein component (D) is (D1) a tabular boron nitride powder having an average particle size of 0.1 to 30 μm, (D2) a granular boron nitride powder having an average particle size of 0.1 to 50 μm, (D3) a spherical and/or crushed aluminum oxide powder having an average particle size of 0.01 to 50 μm, (D4) graphite having an average particle size of 0.01 to 50 μm, or a mixture of two or more of these.

The object of the present invention is preferably achieved by a thermally conductive member comprising this multi-component curable thermally conductive silicone gel composition or a thermally conductive member obtained by curing this composition. It is also preferably achieved by a heat-dissipating structure comprising these thermally conductive members.

The object of the present invention is preferably achieved by a heat-dissipating structure obtained by providing a heat-dissipating member via the multicomponent curable thermally conductive silicone gel composition or a cured product thereof on a heat-dissipating component or a circuit board including a mounted heat-dissipating component.

There are no particular restrictions on the heat-dissipating structure, though an electrical device, an electronic device, or a secondary battery is preferred. A fine heat-dissipating structure may be designed with the desired bond line thickness (BLT).

Effects of the Invention

The present invention is able to provide a multicomponent curable thermally conductive silicone gel composition that, despite a high thermally conductive inorganic filler content and high thermal conductivity above 2.0 W/mK, remains highly fluid as a composition after mixing, providing excellent precision application properties and gap filling properties for electronic components with many gaps, and that is less likely to experience liquid (composition) separation in packaging for a multicomponent curable composition such as a two-part liquid composition, especially in the composition containing an organohydrogenpolysiloxane crosslinking agent, thus providing long-term storage stability. Because the resulting thermally conductive cured product is a soft gel composition, it can relax stress caused by differences in thermal expansion coefficients between electronic components and heat-dissipating structures and prevent damage to components. In addition, a composition can also be designed that results in a thermally conductive cured product that has high releasability and excellent repairability of electronic components. The present invention is also able to provide a thermally conductive member using this thermally conductive silicone gel composition and heat-dissipating structures using this member (in particular, heat-dissipating structures for electrical devices and electronic devices, including heat-dissipating structures for electrical and electronic components and heat-dissipating structures for secondary batteries).

EMBODIMENT OF THE INVENTION

[Multicomponent Curable Thermally Conductive Silicone Gel Composition]

The composition of the present invention is a multicomponent curable thermally conductive silicone gel composition comprising: (A) an alkenyl group-containing organopolysiloxane having a viscosity at 25° C. of 10 to 100,000 mPa·s; (B) an organohydrogenpolysiloxane; (C) a hydrosilylation reaction catalyst; (D) a thermally conductive filler; (E) one or more silane coupling agents or hydrolyzed condensates thereof; and (F) an organopolysiloxane having a hydrolyzable silyl group at one end of the molecular chain; in which at least liquids (I) and (II) below are stored separately. In the present invention each composition stored separately cannot simultaneously include component (A), component (B) and component (C). When component (A), component (B) and component (C) are compounded simultaneously, a spontaneous crosslinking reaction starts, the storage stability of the composition is lost in a short period of time, and the long-term storage stability and handling that are the object of the multicomponent curable composition cannot be realized.

In the present invention, "containing at least liquid (I) and liquid (II)" refers to a multi-component curable composition composed of a plurality of compositions including at least two different compositions defined below. There are no particular restrictions as long as the composition is composed of two or more individually stored compositions. These components are preferably packaged in containers when stored separately. When used, they are stirred in a common container under mechanical power using, for example, a mixer, or are mixed together and applied using, for example, a dispenser based on the mixtures of components. From the standpoint of easy handling and mixing of the components, a multicomponent curable thermally conductive silicone gel composition of the present invention is preferably a two-component curable thermally conductive silicone gel composition substantially composed of liquid (I) and liquid (II) below.

[Liquid (I): Composition Containing an Alkenyl Group-Containing Organopolysiloxane]

Liquid (I) is a composition containing the alkenyl group-containing organopolysiloxane that is a main component of the present composition. It must be a composition that contains components (A), (C), (D), (E) and (F) but not component (B). It may also contain component (G) or any other component. As explained below, the sum of the amount (parts by mass) of component (E) and component (F) in liquid (I) is less than the sum of the amount (parts by mass) of component (E) and component (F) in liquid (II). In particular, the amount of component (F) is significantly smaller. Because liquid (I) contains the alkenyl group-containing organopolysiloxane, the separation of the thermally conductive filler in component (D) is less likely to occur over time despite having a smaller amount (parts by mass) of component (E) and component (F) than liquid (II).

[Liquid (II): Composition Containing an Organohydrogenpolysiloxane]

Liquid (II) is a composition containing the organohydrogenpolysiloxane crosslinking agent of the present composition. It must be a composition that contains components (B), (D), (E) and (F) but not component (C). It may also contain some of component (A), and component (G) or any other component. From the standpoint of the technical effect of the present invention, it is preferably a small amount of component (A). As explained above, the sum of the amount (parts by mass) of component (E) and component (F) in liquid (II) is greater than the sum of the amount (parts by mass) of component (E) and component (F) in liquid (I), that is, the former has a mass ratio relative to the latter in a range from 1.5 to 10.0, the amount of component (F), in particular, being significantly higher. By containing relatively large amounts of component (E) and component (F), which are the surface treatment agents, in liquid (II), separation of component (D), separation of the thermally conductive filler over time can be effectively suppressed in liquid (II). However, in order to make it easier to mix in optional component (G) and the hydrosilylation reaction inhibitor, they can be blended with component (A) beforehand to form a so-called master batch with component (A). Here, the mass ratio of component (A) to component (F) has to be within a range from 0.0 to 0.3.

A composition of the present invention contains a large amount of thermally conductive filler relative to the composition as a whole in order to realize high thermal conductivity. From the standpoint of uniformly mixing liquid (I) and liquid (II) together, the amount of component (D) is preferably in a range from 85 to 98% by mass relative to both compositions as a whole. When the approach is taken simply to reduce the amount of component (D) in the composition (liquid (II)) in order to solve the separation problem, it can be difficult to design a composition which has a thermal conductivity of 2.0 W/mK or more, preferably 3.5 W/mK or more, and more preferably 4.0 W/mK or more despite the large amount of thermally conductive filler in liquid (I) and the large amount of thermally conductive filler in the composition as a whole. Also, when the amount of thermally conductive filler is simply reduced in liquid (II), the viscosity and fluidity of compositions (I) and (II) are very different, and it may be difficult to uniformly mix together the multicomponent curable thermally conductive silicone gel composition before use using a simple method such as a mixer or dispenser, and the handling efficiency may be very poor.

A multicomponent curable thermally conductive silicone gel composition of the present invention can be designed to contain a large amount of thermally conductive filler in the compositions of both liquid (I) and liquid (II) and in the composition as a whole. This is done to realize long-term storage stability without impairing the thermal conductivity and handling and workability of the composition as a whole. Also, a multicomponent curable thermally conductive silicone gel composition of the present invention can be designed that maintains high fluidity as a whole after mixing, resulting in excellent precision coating properties and gap filling properties for electronic components with many gaps. If desired, the viscosity and thixotropic property of the compositions before curing and after mixing, and the releasability and repairability of the thermally conductive silicone gel after curing can be adjusted for excellent vertical retention during coating and excellent silicone gel repair.

As mentioned above, a multicomponent curable thermally conductive silicone gel composition of the present invention is obtained by mixing together a plurality of individually stored compositions, including the liquid (I) and the liquid (II), before use. The compositions can be mixed together by introducing each component of the multicomponent curable thermally conductive silicone gel composition to a mechanical mixing device (for example, a general-purpose mixer such as a static mixer) from the storage containers using metering pumps and mixed together for use, or by filling packages with each component and using a dispenser that can mix together the components by squeezing out each component at a fixed volume or volume ratio from the packages. When mixing together the components of a multicomponent curable thermally conductive silicone gel composition with an open mixer before use, the resulting mixture is preferably subjected to defoaming before use. Liquid (I) and liquid (II) constituting a multi-component curable thermally conductive silicone gel composition of the present invention, have excellent long-term storage stability, do not experience separation, and can be uniformly mixed together using a simple method. As a result, handling and workability are excellent.

The following is a description of each component constituting a multicomponent curable thermally conductive silicone gel composition of the present invention.

[(A) Alkenyl Group-Containing Organopolysiloxane]

The alkenyl group-containing organopolysiloxane in component (A) is a component constituting liquid (I) and a main component in the thermally conductive silicone gel composition. Its viscosity at 25° C. is in a range from 10 to 100,000 mPa·s. The viscosity at 25° C. for component (A) is preferably in a range from 10 to 100,000 mPa·s and more preferably in a range from 10 to 10,000 mPa·s. When the viscosity of component (A) is less than 10 mPa·s, the resulting silicone gel tends to have poorer physical properties. When the viscosity of component (A) is greater than 100,000 mPa·s, the handling, workability, and gap filling properties of the resulting silicone gel composition tend to be poorer.

Component (A) is composed of one or more alkenyl group-containing organopolysiloxanes. There are no particular restrictions on the molecular structure of the alkenyl group-containing organopolysiloxanes, which can be linear, branched, cyclic, three-dimensionally reticulated, or a combination of these. Component (A) may consist solely of linear alkenyl group-containing organopolysiloxanes, solely of alkenyl group-containing organopolysiloxanes with a branched structure, or a mixture of linear alkenyl group-containing organopolysiloxanes and alkenyl group-containing organopolysiloxanes with a branched structure. Examples of an alkenyl group in the molecule include a vinyl group, an allyl group, a butenyl group, and a hexenyl group. Examples of an organic group other than an alkenyl group in component (A) include an alkyl group such as a methyl group, ethyl group or propyl group; an aryl group such as a phenyl group or tolyl group; or a monovalent hydrocarbon group excluding alkenyl groups such as a 3,3,3-trifluoropropyl group or other halogenated alkyl group.

Especially preferred as component (A) is a linear alkenyl group-containing organopolysiloxane, which preferably contains at least an alkenyl group at both ends of the molecular chain but may contain an alkenyl groups at both ends of the molecular chain. There are no particular restrictions on component (A). However, examples include dimethylpolysiloxane capped at both ends of the molecular chain with a dimethylvinylsiloxy group, dimethylsiloxane/methylphenylsiloxane copolymers capped at both ends of the molecular chain with a dimethylvinylsiloxy group, dimethylsiloxane/methylvinylsiloxane copolymers capped at both ends of the molecular chain with a trimethylsiloxy group, dimethylsiloxane/methylvinylsiloxane/methylphenylsiloxane copolymer capped at both ends of the molecular chain with a trimethylsiloxy group, dimethylsiloxane/methylvinylsiloxane copolymers capped at both ends of the molecular chain with a silanol groups, polymers in which some of the methyl groups in the polymer are substituted with an alkyl group other than a methyl group such as an ethyl group or a propyl group, or a halogenated alkyl group such as a 3,3,3-trifluoropropyl group, polymers in which the vinyl group of the polymer is substituted with an alkenyl group other than a vinyl group such as an allyl group, a butenyl group, or a hexenyl group, and mixtures of two or more of these polymers. From the standpoint of preventing contact faults, low molecular weight siloxane oligomers (octamethyltetrasiloxane (D4) and decamethylpentasiloxane (D5)) are preferably reduced or eliminated from among these alkenyl group-containing organopolysiloxanes.

Component (A) in the present invention may have an alkoxysilyl-containing group bonded to a silicon atom represented by the following formula.

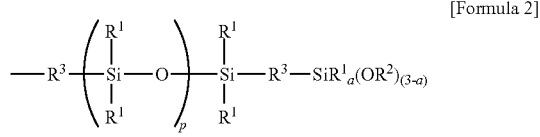

[Formula 2]

(In this formula, each $R^1$ is the same or different monovalent hydrocarbon group having no aliphatic unsaturated bond, $R^2$ is an alkyl group, each $R^3$ is the same or different alkylene group, a is an integer from 0 to 2, and p is an integer from 1 to 50.) Organopolysiloxanes with these functional groups hold down the viscosity of the composition in an uncured state, and function as a surface treatment agent for component (D) due to the alkoxysilyl group in the molecule. As a result, thickening and oil bleeding are suppressed in the resulting composition, and unhindered handling and workability may be obtained.

[(B) Organohydrogenpolysiloxane]

Component (B) is a component in liquid (II), and is the primary crosslinking agent for a thermally conductive silicone gel composition of the present invention. Organohydrogenpolysiloxanes having two or more silicon-bonded hydrogen atoms in the molecule can be used without any restrictions. However, from the standpoint of the flexibility and vertical retention of the resulting thermally conductive silicone gel composition, the (average) number of silicon-bonded hydrogen atoms in the organohydrogenpolysiloxane molecule is preferably no more than eight.

[Amount of Organohydrogenpolysiloxane (Crosslinking Agent) in the Composition]

In a composition of the present invention, the amount of silicon-bonded hydrogen atoms in component (B) has to be at least in a range from 0.2 to 5 mol or from 0.3 to 2.0 mol or from 0.4 to 1.0 mol per mol of alkenyl groups in component (A). It is especially preferred from the standpoint of the formation of a thermally conductive silicone gel cured product and the releasability and repairability of the cured product. More specifically, when the amount of silicon-bonded hydrogen atoms in component (B) is below the lower limit, the thermally conductive silicone gel composition may experience poor curing. When the amount exceeds the upper limit, the amount of silicon-bonded hydrogen atoms is excessive, and the releasability and repairability of the cured product may be impaired.

[Suitable Crosslinking Extender: Component (B1)]

From the standpoint of the releasability and repairability of the thermally conductive silicone gel cured product obtained by curing a composition of the present invention, component (B1) in component (B) has a viscosity 25° C. from 1 to 1,000 mPa·s and contains an average of 2 to 4 silicon-bonded hydrogen atoms in the molecule. It preferably contains a linear organohydrogenpolysiloxane having at least two of these atoms on a side chain of the molecular chain. The structure of component (B1) means that component (B1) functions in the present composition as a crosslinking extender due to the hydrosilylation reaction of the silicon-bonded hydrogen atoms in the side chain of the molecular chain.

In a thermally conductive silicone gel composition of the present invention, component (B1) functions as a crosslinking extender for component (A), and gradually crosslinks the entire composition to form a gel-like cured product. Because component (B) has on average at least 2 silicon-bonded hydrogen atoms on a side chain of the molecular chain, and on average only 2 to 4 silicon-bonded hydrogen atoms in the molecule, the cross-linking extension reaction proceeds primarily due to the 2 to 4 silicon-bonded hydrogen atoms on the side chain, and a thermally conductive silicone gel cured product is formed with excellent releasability from members and excellent repairability for repair and reuse.

From the standpoint of improved releasability and repairability, component (B1-1) in component (B) is preferably a linear organohydrogenpolysiloxane having an average of 2 to 3 silicon-bonded hydrogen atoms in the molecule and, among these, at least 2 atoms on a side chain of the molecular chain. Component (B1-1-1) is especially preferably an organohydrogenpolysiloxane having an average of 2 to 3 silicon-bonded hydrogen atoms only on a side chain of the molecular chain. Most preferably, the silicon-bonded hydrogen atoms in component (B1) average 2 and only on a side chain of the molecular chain.

Examples of component (B1) include methyl hydrogen siloxane/dimethyl siloxane copolymers capped on both ends of the molecular chain with trimethylsiloxy groups and methyl hydrogen siloxane/dimethyl siloxane copolymers capped on both ends of the molecular chain with dimethyl hydrogen siloxy groups. The present invention is not limited to these examples and some of the methyl groups may be substituted with, for instance, a phenyl group, a hydroxyl group, or an alkoxy group.

There are no particular restrictions on the viscosity of component (B1) at 25° C., but a viscosity in a range from 1 to 500 mPa·s is preferred. From the standpoint of preventing contact faults, low molecular weight siloxane oligomers (octamethyltetrasiloxane (D4) and decamethylpentasiloxane (D5)) are preferably reduced or eliminated.

[Use of Other Crosslinking Agents]

Examples of organohydrogenpolysiloxanes other than component (B1) used in component (B) of the present invention as crosslinking agents include methyl hydrogen siloxane/dimethyl siloxane copolymers capped at both ends of the molecular chain with a trimethylsiloxy group and containing more than 4 silicon-bonded hydrogen atoms in the molecule on average, methyl hydrogen siloxane/dimethyl siloxane copolymers capped at both ends of the molecular chain with a dimethylsiloxy group and containing more than 4 silicon-bonded hydrogen atoms in the molecule on average, methyl hydrogen polysiloxane capped at both ends of the molecular chain with a trimethylsiloxy group, dimethyl polysiloxane capped at both end of the molecular chain with a dimethyl hydrogen siloxy group, and methyl hydrogen siloxy group-containing siloxane resins. However, at least the aforementioned amount of component (B1) is preferably included as a crosslinking extender. From the standpoint of the curing properties of a composition of the present invention and the releasability and repairability of the cured product, the ratio of component (B1) is preferably at or above a certain amount even when other organohydrogenpolysiloxanes are included.

More specifically, where $[H_{B1}]$ is the silicon-bonded hydrogen atoms in component (B1) of the composition and $[H_{non-B1}]$ is the silicon-bonded hydrogen atoms in organohydrogenpolysiloxanes other than component (B1), the value of $[H_{non-B1}]/([H_{B1}]+[H_{non-B1}])$ is preferably in a range from 0.0 to 0.70. The same value may be 0.0 to 0.50, 0.0 to 0.25, or 0.0. When the value for $[H_{non-B1}]/([H_{B1}]+[H_{non-B1}])$ exceeds the upper limit, the effect of component (B) in the crosslinking agents of the composition is relatively small, the releasability and repairability of the cured product may be impaired, and poor curing may occur.

From the standpoint of the technical effects of the present invention, the following combinations of organohydrogenpolysiloxanes are preferred as crosslinking agents in the present composition.

(B1): Component (B1) alone or component (B1) substantially alone with no other organohydrogenpolysiloxane intentionally included in the composition.

(B'2): An organohydrogen polysiloxane mixture containing component (B1) and one type or two or more types selected from among dimethyl polysiloxane capped at both ends of the molecular chain with a dimethyl hydrogen siloxy group, a methyl hydrogen siloxane/dimethyl siloxane copolymer capped at both ends of the molecular chain with a trimethylsiloxy group and containing on average 5 to 8 silicon-bonded hydrogen atoms in the molecule, and a methyl hydrogen siloxane/dimethyl siloxane copolymer capped at both ends of the molecular chain with a dimethylsiloxy group and containing on average 5 to 8 silicon-bonded hydrogen atoms in the molecule. Even when component (B'2) is used, the value for $[H_{non-B1}]/([H_{B1}]+[H_{non-B1}]$ is preferably within the range mentioned above.

When the organohydrogenpolysiloxane in the composition is a mixture represented by (B'2) above, especially a mixture of component (B1) and a dimethylpolysiloxane capped at both ends of the molecular chain with a dimethylhydrogensiloxy group, from the standpoint of improving the curability of the composition, the amount of silicon-bonded hydrogen atoms in the organohydrogenpolysiloxane is preferably in a range from 0.5 to 1.5 mol or from 0.7 to 1.0 mol. When the organohydrogenpolysiloxane in the composition is substantially component (B1) alone, the amount of silicon-bonded hydrogen atoms in the organohydrogenpolysiloxane is preferably in a range from 0.3 to 1.5 mol or from 0.4 to 1.0 mol. When the types and amount of organohydrogenpolysiloxanes in the composition are within the ranges mentioned above, the fluidity and gap filling properties of the thermally conductive silicone gel composition are excellent, and the physical properties of the resulting thermally conductive silicone gel cured product, especially releasability and repairability, are excellent. In other words, the technical effects of the present invention are excellent.

[(C) Hydrosilylation Reaction Catalyst]

The hydrosilylation reaction catalyst is a component in liquid (I), and examples include a platinum-based catalyst, a rhodium-based catalyst, and a palladium-based catalyst. A platinum-based catalyst is especially preferred because it promotes curing of the present composition to a remarkable degree. Examples of platinum-based catalysts include platinum fine powder, chloroplatinic acid, alcohol solutions of chloroplatinic acid, platinum-alkenylsiloxane complexes, platinum-olefin complexes, platinum-carbonyl complexes, and any of these platinum-based catalysts dispersed or encapsulated in a thermoplastic resin such as a silicone resin, polycarbonate resin, or acrylic resin. A platinum-alkenylsiloxane complex is especially preferred. Examples of alkenylsiloxane include 1,3-divinyl-1,1,3,3-tetramethyldisiloxane, 1,3,5,7-tetramethyl-1,3,5,7-tetravinylcyclotetrasiloxane, alkenyl siloxanes in which some of the methyl groups in the alkenyl siloxane have been substituted with, for example, ethyl groups or phenyl groups, and alkenyl siloxanes in which some of the vinyl groups in the alkenyl siloxane have been substituted with, for example, allyl groups or hexenyl groups. In particular, 1,3-divinyl-1,1,3,3-tetramethyldisiloxane is preferred because this platinum-alkenylsiloxane complex has good stability. Also, from the standpoint of improving the handling efficiency and pot life of the composition, a granular platinum-containing hydrosilylation reaction catalyst dispersed or encapsulated in a thermoplastic resin may be used. A non-platinum-based metal catalyst such as an iron, ruthenium, or iron/cobalt catalyst may be used to promote the hydrosilylation reaction.

The amount of hydrosilylation reaction catalyst added is a catalytic amount, preferably an amount with respect to component (A) such that the metal atoms are within a range from 0.01 to 500 ppm, from 0.01 to 100 ppm, or from 0.01 to 50 ppm by mass.

[Hydrosilylation Reaction Inhibitor]

From the standpoint of handling efficiency, a composition of the present invention preferably also contains a hydrosilylation reaction inhibitor. A hydrosilylation reaction inhibitor is a component for inhibiting a hydrosilylation reaction in a thermally conductive silicone gel composition of the present invention. Specific examples include acetylene-based (such as ethynylcyclohexanol), amine-based, carboxylate-based, and phosphite-based reaction inhibitors. The amount of reaction inhibitor added is usually from 0.001 to 5% by mass of the overall silicone gel composition. Although there are no particular restrictions, acetylene-based compounds such as 3-methyl-1-butyn-3-ol, 3,5-dimethyl-1-hexyn-3-ol and 3-phenyl-1-butyn-3-ol; enyne-based compounds such as 3-methyl-3-penten-1-yne and 3,5-dimethyl-3-hexen-1-yne; cycloalkenyl siloxanes such as 1,3,5,7-tetramethyl-1,3,5,7-tetravinylcyclotetrasiloxane and 1,3,5,7-tetramethyl-1,3,5,7-tetrahexenylcyclotetrasiloxane; and triazole compounds such as benzotriazole can be used to improve the handling and workability of the silicone gel composition.

[(D) Thermally Conductive Filler]

Component (D) is a component used in both liquid (I) and liquid (II), and is a thermally conductive filler used to impart thermal conductivity to the composition and to the thermally conductive member obtained by curing the composition. Component (D) is preferably at least one or more types of powder and/or fiber selected from a group consisting of pure metals, alloys, metal oxides, metal hydroxides, metal nitrides, metal carbides, metal silicides, carbons, soft magnetic alloys and ferrites. A metal powder, metal oxide powder, metal nitride powder, or carbon powder is preferred.

Some or all of the thermally conductive filler is preferably subjected to surface treatment with the alkoxysilane in component (E) described below. Separately from component (E) or together with component (E), these powders and/or fibers can be subjected to surface treatment agents known as coupling agents. In addition to Component (E), surface treatment agents used to treat the powders and/or fibers in component (D) include surfactants, other silane coupling agents, aluminum-based coupling agents, and silicone-based surface treatment agents.

Examples of pure metals include bismuth, lead, tin, antimony, indium, cadmium, zinc, silver, copper, nickel, aluminum, iron, and metallic silicon. Examples of alloys include those composed of two or more metals selected from a group consisting of bismuth, lead, tin, antimony, indium, cadmium, zinc, silver, aluminum, iron, and metallic silicon. Examples of the metal oxides include alumina, zinc oxide, silicon oxide, magnesium oxide, beryllium oxide, chromium oxide, and titanium oxide. Examples of metal hydroxides include magnesium hydroxide, aluminum hydroxide, barium hydroxide, and calcium hydroxide. Examples of metal nitrides include boron nitride, aluminum nitride, and silicon nitride. Examples of metal carbides include silicon carbide, boron carbide, and titanium carbide. Examples of metal silicides include magnesium silicide, titanium silicide, zirconium silicide, tantalum silicide, niobium silicide, chromium silicide, tungsten silicide, and molybdenum silicide. Examples of carbon include diamond, graphite, fullerene, carbon nanotube, graphene, activated carbon, and amorphous carbon black. Examples of soft magnetic alloys include Fe—Si alloys, Fe—Al alloys, Fe—Si—Al alloys, Fe—Si—Cr alloys, Fe—Ni alloys, Fe—Ni—Co alloys, Fe—Ni—Mo alloys, Fe—Co alloys, Fe—Si—Al—Cr alloys, Fe—Si—B alloys, and Fe—Si—Co—B alloys. Examples of ferrites include Mn—Zn ferrite, Mn—Mg—Zn ferrite, Mg—Cu—Zn ferrite, Ni—Zn ferrite, Ni—Cu—Zn ferrite, and Cu—Zn ferrite.

Component (D) is preferably silver powder, aluminum powder, aluminum oxide powder, zinc oxide powder, aluminum nitride powder, or graphite. When the composition requires electrical insulating properties, a metal oxide-based powder or a metal nitride-based powder is preferred, and aluminum oxide powder, zinc oxide powder, or aluminum nitride powder is especially preferred.

There are no particular restrictions on the shape of component (D), which may be spherical, acicular, disk shaped, rod shaped, or irregular. There are no particular restrictions on the average particle size of component (D), but is preferably in a range from 0.01 to 100 μm, and more preferably in a range from 0.01 to 50 μm.

Component (D) is preferably (D1) tabular boron nitride powder having an average particle size of 0.1 to 30 μm, (D2) granular boron nitride powder having an average particle size of 0.1 to 50 μm, (D3) spherical and/or crushed aluminum oxide powder having an average particle size of 0.01 to 50 μm, (D4) spherical and/or crushed graphite having an average particle size of 0.01 to 50 μm, or a mixture of two or more of these. Especially preferred is a mixture of two or more of spherical and/or crushed aluminum oxide powders having an average particle size of 0.01 to 50 μm. By combining an aluminum oxide powder with a large particle size and an aluminum oxide powder with a small particle size at a ratio following the close packing theoretical distribution curve, filling efficiency can be improved, the viscosity can be reduced, and the thermal conductivity can be increased.

In each of liquid (I) and liquid (II), the amount of component (D) is in a range from 600 to 3,500 parts by mass, and preferably in a range from 1,200 to 3,000 parts by mass, per 100 parts by mass of component (A) in the composition as a whole. In other words, in the composition as a whole, the sum of component (D) in liquid (I) and in liquid (II) may be in a range from 1,200 to 7,000 parts by mass, in a range from 2,400 to 6,000 parts by mass, or in a range from 2,400 to 5,500 parts by mass. When the amount of component (D) is below the lower limit of this range, the thermal conductivity of the resulting composition is less than 2.0 W/m. When the amount exceeds the upper limit of this range, the viscosity of the resulting composition is significantly higher despite the inclusion of component (E) or a surface-treated component (D), and handling, workability, and the gap filling properties of the composition are lower.

The composition of the present invention has a thermal conductivity of 2.0 W/mK or more, and the amount of component (D) is preferably in a range of from 85 to 98% by mass, and more preferably within a range of 87 to 95% by mass, of the composition as a whole. In this range, a thermally conductive silicone gel composition can be designed which realizes thermal conductivity of 2.0 W/mK or higher, preferably 3.5 W/mK or higher, more preferably 4.0 W/mK or higher, and even more preferably 5.0 W/mK or higher while maintaining the excellent gap filling properties and fluidity that are an object of the present invention.

[Other Inorganic Fillers]

Optional components in a composition of the present invention may include inorganic fillers such as fumed silica, wet silica, crushed quartz, titanium oxide, magnesium carbonate, zinc oxide, iron oxide, diatomaceous earth, and carbon black ("inorganic filler" below). Although the use of inorganic fillers whose surface has been subjected to hydrophobic treatment with an organosilicon compound (such as a silazane) is not completely prohibited, the present invention is preferably substantially free of fillers other than component (D) from the standpoint of the technical effect of the present invention which combines high thermal conductivity and gap filling properties. When a reinforcing filler with a wide BET specific surface area such as reinforcing silica is included in the present composition, and component (D) is blended into the composition in an amount imparting thermal conductivity of at least 3.5 W/mK, it may be difficult to achieve the rheological characteristics of the present invention. Here, "substantially free" means 1% by mass or less, and preferably 0.5% by mass or less of a filler other than component (D) in the composition. Ideally, the amount of filler other than component (D) intentionally added to the composition is 0.0% by mass.

[Surface Treatment of Component (D)]

The composition contains a specific amount of component (E) and component (F) which are two surface treatment agents with different chemical structures. When the overall amount of component (D) in the present invention is 100% by mass, the amount of these components blended into the composition is from 0.1 to 5.0% by mass, and component (D) is preferably surface-treated with these components. Any method can be used to surface-treat component (D). However, from the standpoint of improving the fluidity, gap filling properties, and thixotropic properties of the composition, preferably at least some of component (D) is surface-treated with component (E) before component (D) is surface-treated with component (F).

Here, surface-treated component (D) is included in the compositions of both liquid (I) and liquid (II). In the present invention, the amount of component (E) and component (F) serving as surface treatment agents in each of liquid (I) and liquid (II) is very different, especially component (F). The surface treatment of component (D) in both compositions should reflect the amount of components (E) and (F) used. The amount of component (E) and component (F) in liquid (I) and liquid (II) is preferably at least 90% by mass and more preferably 100% by mass of the amount used as a surface treating agent for component (D).

[(E) One or More Silane Coupling Agents or Hydrolyzed Condensates Thereof]

Component (E) is a surface treating agent for component (D), and is component used in both liquid (I) and liquid (II) to improve the blending amount of component (D), and improve the viscosity and fluidity of the composition as a whole. Component (E) can by any silane coupling agent common in the art or hydrolyzed condensate thereof as there are no particular restrictions. However, use of component (E1) described below is preferred, which is an alkoxysilane having an alkyl group with 6 or more carbon atoms in the molecule.

The silane coupling agent in component (E) is represented by the following general formula.

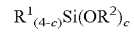

In the formula, $R^1$ is a monovalent hydrocarbon group, an epoxy group-containing organic group, a methacrylic group-containing organic group, or an acryl group-containing organic group. Examples of monovalent hydrocarbon groups in $R^1$ include a straight-chain alkyl group such as a methyl group, an ethyl group, a propyl group, a butyl group, a hexyl group, and a decyl group; a branched alkyl group such as an isopropyl group, a tertiary butyl group and an isobutyl group; a cyclic alkyl group such as a cyclohexyl group; an alkenyl group such as a vinyl group, an allyl group, a butenyl group, a pentenyl group, a hexenyl group, and a heptenyl group; an aryl group such as a phenyl group, a tolyl group, and a xylyl group; an aralkyl group such as a benzyl group, and phenethyl group; and a substituted or unsubstituted monovalent hydrocarbon group including a halogenated alkyl group such as a 3,3,3-trifluoropropyl group and a 3-chloropropyl group. Examples of epoxy group-containing organic groups in $R^4$ include a glycidoxyalkyl group such as a 3-glycidoxypropyl group and a 4-glycidoxybutyl group; and an epoxycyclohexylalkyl group such as a 2-(3,4-epoxycyclohexyl) ethyl group and a 3-(3,4-epoxycyclohexyl) propyl group. Examples of a methacrylic group-containing organic groups in $R^1$ include a methacryloxyalkyl group such as a 3-methacryloxypropyl group and a 4-methacryloxybutyl group. Examples of acryl group-containing organic groups in $R^1$ include an acryloxyalkyl group such as a 3-acryloxypropyl group and a 4-acryloxysibutyl group.

Examples of $R^2$ include an alkyl group, an alkoxyalkyl group, an alkenyl group, or an acyl group. Examples of alkyl groups in $R^2$ include a linear alkyl group, a branched alkyl group, and a cyclic alkyl group. Examples of alkoxyalkyl groups in $R^2$ include a methoxyethyl group and a methoxypropyl group. Examples of alkenyl groups in $R^2$ include a vinyl group, an allyl group, a butenyl group, a pentenyl group, and a hexenyl group. Examples of acyl groups in $R^2$ include an acetyl group and an octanoyl group.

c is an integer from 1 to 3, preferably 3.

Examples of component (E) other than component (E1) include methyltrimethoxysilane, methyltriethoxysilane, ethyltrimethoxysilane, n-propyltrimethoxysilane, butyltrimethoxysilane, pentyltrimethoxysilane, vinyltrimethoxysilane, vinyltriethoxysilane, methylvinyldimethoxysilane, allyltrimethoxysilane, allylmethyldimethoxysilane, butenyltrimethoxysilane, 3-glycidoxypropyltrimethoxysilane, 3-glycidoxypropylmethyldimethoxysilane, 3-glycidoxypropyltriethoxysilane, 3-methacryloxypropyltrimethoxysilane, 3-methacryloxypropyltriethoxysilane, 3-methacryloxypropylmethyldimethoxysilane, 3-acryloxypropyltrimethoxysilane, and 3-acryloxypropylmethyldimethoxysilane.

[(E1) Alkylalkoxysilane]

Component (E1) is a preferable component in the present composition along with component (B1), and is an alkoxysilane having an alkyl group with 6 or more carbon atoms in the molecule. Specific examples of alkyl groups with 6 or more carbon atoms include an alkyl group such as a hexyl group, an octyl group, a dodecyl group, a tetradecyl group, a hexadecyl group, and an octadecyl group, and an aralkyl group such as a benzyl group and a phenylethyl group. An alkyl group with 6 to 20 carbon atoms is preferred. When an alkoxysilane having an alkyl group with less than 6 carbon atoms is used, the viscosity lowering effect on the composition is insufficient, the viscosity of the composition increases, and the desired fluidity and gap filling properties cannot be realized. When an alkoxysilane having an alkyl group with more than 20 carbon atoms is used, the industrial applicability is poor, and compatibility with various types of component (A) is low.

Preferably, component (E1) is an alkoxysilane represented by the following general formula.

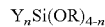
$$Y_nSi(OR)_{4-n}$$

(In this formula, Y is an alkyl group having from 6 to 18 carbon atoms, R is an alkyl group having from 1 to 5 carbon atoms, and n is the integer 1 or 2.)

Examples of OR groups include a methoxy group, an ethoxy group, a propoxy group, and a butoxy group, but a methoxy group or ethoxy group is preferred. Also, n is 1, 2 or 3, but 1 is especially preferred.

Specific examples of component (E1) include $C_6H_{13}Si(OCH_3)_3$, $C_8H_{17}Si(OC_2H_5)_3$, $C_{10}H_{21}Si(OCH_3)_3$, $C_{11}H_{23}Si(OCH_3)_3$, $C_{12}H_{25}Si(OCH_3)_3$, and $C_{14}H_{29}Si(OC_2H_5)_3$, but decyltrimethoxysilane is especially preferred.

Component (E) of the present invention preferably contains component (E1). Component (E1) may be used alone or a mixture of component (E1) and another silane coupling agent may be used. If desired, a silane coupling agent other than component (E1) may be used alone, and some or all of the silane coupling agent may be hydrolyzed beforehand.

Unlike component (F) described above, the technical effects of the present invention can be realized when the amount of component (E) in liquid (II) of the present invention is greater than the amount of component (E) in liquid (I). More specifically, the mass ratio of the amount of component (E) in liquid (II) relative to the amount of component (E) in liquid (I) may be in a range from 0.5 to 2.0 and may be in a range from 0.75 to 2.0. However, from the standpoint of improving the blending stability of component (D), it is essential to combine component (E) and component (F) in the present invention.

[(F) Polysiloxane Surface Treatment Agent Having a Hydrolyzable Silyl Group at One End of the Molecular Chain]

Component (F) is a component used in both liquid (I) and liquid (II). Unlike component (E), it is a surface treatment agent having a hydrolyzable silyl group at one end of the molecular chain and having a polysiloxane structure. In treatment of component (D) with component (E), the surface treatment is preferably performed with component (E) before the surface treatment with component (F). In this way, a thermally conductive silicone gel composition can be provided with improved fluidity, gap filling properties, and thixotropic properties even when a large amount of the thermally conductive filler in component (D) has been included.

Specifically, component (F) is an organopolysiloxane having a hydrolyzable silyl group at one end of the molecular chain. There are no particular restrictions on the structure but component (F) is an organopolysiloxane represented by general formula (1) or general formula (2) below, or a mixture of these.

(i) Organopolysiloxanes having a viscosity at 25° C. of from 10 to less than 10,000 mPa·s represented by general formula (1):

[Formula 3]

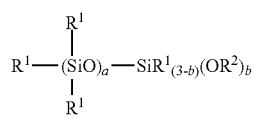
(1)

(In this formula, $R^1$ represents an unsubstituted or substituted monovalent hydrocarbon group, each $R^2$ independently represents a hydrogen atom, an alkyl group, an alkoxyalkyl group, or an acyl group, a is an integer from 5 to 100, and b is an integer from 1 to 3.)

(ii) Organopolysiloxanes represented by general formula (2):

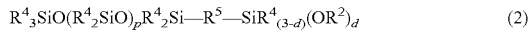

$$R^4{}_3SiO(R^4{}_2SiO)_p R^4{}_2Si\text{—}R^5\text{—}SiR^4{}_{(3-d)}(OR^2)_d \quad (2)$$

(In this formula, $R^4$ represents the same or different monovalent hydrocarbon group, $R^5$ is an oxygen atom or a divalent hydrocarbon group, $R^2$ is the same as above, p is an integer from 100 to 500, and d is the same as above.)

(i) Component (F) represented by general formula (1) has a hydrolyzable silyl group at one end of the molecular chain. By using component (F) as a surface treatment agent for component (D), a thermally conductive silicone gel composition with excellent vertical retention can be obtained in which the fluidity, gap filling properties, and thixotropic properties of the composition can be improved without adversely affecting handling and moldability despite the large amount of component (D) included. Good adhesiveness can also be imparted to a substrate in contact during the curing process. In general formula (1), $R^1$ is independently an unsubstituted or substituted monovalent hydrocarbon group. Examples include linear alkyl groups, branched alkyl groups, cyclic alkyl groups, alkenyl groups, aryl groups, aralkyl groups, and halogenated alkyl groups. Examples of linear alkyl groups include a methyl group, an ethyl group, a propyl group, a hexyl group, and an octyl group. Examples of branched alkyl groups include an isopropyl group, an isobutyl group, a tert-butyl group, and a 2-ethylhexyl group. Examples of cyclic alkyl groups include a cyclopentyl group and a cyclohexyl group. Examples of alkenyl groups include a vinyl group and an allyl group. Examples of aryl groups include a phenyl group and a tolyl group. Examples of aralkyl groups include a 2-phenylethyl group and a 2-methyl-2-phenylethyl group. Examples of halogenated alkyl group includes a 3,3,3-trifluoropropyl group, a 2-(nonafluorobutyl) ethyl group, and a 2-(heptadecafluorooctyl) ethyl group. $R^1$ is preferably a methyl group or a phenyl group.

In general formula (1), each $R^2$ is independently a hydrogen atom, an alkyl group, an alkoxyalkyl group, an alkenyl group, or an acyl group. Examples of alkyl groups include the linear alkyl groups, branched alkyl groups, and cyclic alkyl groups listed in $R^1$ above. Examples of alkoxyalkyl groups include a methoxyethyl group and a methoxypropyl group. Examples of acyl groups include an acetyl group and an octanoyl group. $R^2$ is preferably an alkyl group, and more preferably a methyl group or an ethyl group.

In general formula (1), a is an integer in a range from 5 to 250, and preferably in a range from 10 to 200. Also, b is an integer from 1 to 3, and is preferably 2 or 3.

(ii) Component (F) represented by general formula (2) has a hydrolyzable silyl group bonded via a divalent hydrocarbon group such as an alkylene group or an oxygen atom at one end of the molecular chain. By using component (F) as a surface treatment agent for component (D), a thermally conductive silicone gel composition with excellent vertical retention can be obtained in which the fluidity, gap filling properties, and thixotropic properties of the composition can be improved without adversely affecting handling and moldability despite the large amount of component (D) included.

Each $R^4$ in the formula is the same or different monovalent hydrocarbon group. Examples include the same linear alkyl groups, branched alkyl groups, cyclic alkyl groups, aryl groups, aralkyl groups, alkenyl groups, and halogenated alkyl groups described above, preferably a straight-chain alkyl group, and more preferably a methyl group. $R^5$ in the formula is an oxygen atom or a divalent hydrocarbon group. Examples of divalent hydrocarbon group in $R^5$ include alkylene groups such as a methylene group, an ethylene group, a propylene group, an isopropylene group, and a butylene group; and an alkyleneoxyalkylene group such as an ethyleneoxyethylene group and an ethyleneoxypropylene group. $R^5$ is preferably an oxygen atom. $R^2$ in the above formula is the same as the groups described above. Also, p in the formula is an integer from 100 to 500, preferably an integer from 105 to 500, more preferably an integer from 110 to 500, and still more preferably an integer from 110 to 200. When p in the formula is below the lower limit of this range, there is a possibility that component (D) cannot be included in an amount large enough to obtain the thermally conductive silicone gel composition of the present invention. When the value exceeds the upper limit of the range, the volume of the molecules bound to the surface of component (D) may be too large, and there is a possibility that component (D) cannot be included in a large enough amount. In addition, d in the formula is an integer from 1 to 3, and is preferably 3.

The total amount of component (E) and component (F) used may be from 0.1 to 5.0% by mass, from 0.1 to 4.0% by mass, and from 0.2 to 3.5% by mass relative to component (D). When the amount of these components used is below the lower limit of this range, the viscosity reducing effect on the composition is insufficient. When the amount of component (E) and component (F) used exceeds the upper limit of this range, the viscosity reducing effect becomes saturated, the alkoxysilane may separate, and the storage stability of the composition may decline.

The mass ratio of component (E) to component (F) may be in a range from 5:95 to 95:5, in a range from 15:85 to 70:30, and in a range from 15:85 to 40:60. Component (E) and component (F) need to be used together at least in this range. If only one of these components is used or if the components are used at a mass ratio outside of this range, fluidity, gap filling properties, and thixotropic properties of the composition cannot be sufficiently improved. In other words, the technical effect of the present invention is insufficient.

In the present invention, component (E) and component (F) are preferably blended together in a form in which component (D) has been surface-treated with these components. Here, the surface treatment of component (D) with component (E) and component (F) is performed simultaneously, or component (D) is surface treated with one of these components before component (D) is surface treated with the other component. Preferably, component (D) is surface treated primarily with component (E) before component (D) is surface treated with component (F) or at least some of component (D) is surface treated with component (E) before being surface treated with component (F) from the standpoint of improving the fluidity and gap filling properties of the composition.

[Amount of Component (E) and Component (F) in Liquid (I) and Liquid (II)]

In order to realize the technical effects of the present invention, a multicomponent curable thermally conductive silicone gel composition of the present invention is characterized by a significant difference between the amounts of component (E) and component (F) surface treatment agent in liquid (I) and liquid (II), especially component (F). Specifically, the mass ratio of the sum of component (E) and component (F) in liquid (II) to the sum of component (E) and component (F) in liquid (I) must be in a range from 1.5 to 10.0, but the mass ratio may be in a range from 2.5 to 7.5 or in a range from 3.0 to 7.0.

In a multicomponent curable thermally conductive silicone gel composition of the present invention, the amount of component (F) used in liquid (II) is preferably significantly greater, especially the amount of component (F) used as a surface treatment agent for component (D). Specifically, the mass ratio of the amount of component (F) used in liquid (II) to the amount of component (F) used in liquid (I) must be in a range from 1.5 to 10.0, but the mass ratio may be in a range from 2.5 to 7.5 or in a range from 3.0 to 7.0. In the present invention, component (E) is essential in both liquid (I) and liquid (II). The amount may be substantially equivalent despite the significantly greater amount of component (F) used in liquid (II). In this way, the technical effects of the present invention can be favorably realized.

The surface treatment method using component (E) and component (F) may be the same in liquid (I) and liquid (II) but there are no particular restrictions. The thermally conductive inorganic filler in component (D) can, for example, be subjected to a direct treatment method, integral blending method, or dry concentrate method. Direct treatment methods include the dry method, slurry method, and spray method. Integral blending methods include the direct method and the master batch method. Drying methods include the slurry method and the direct method. Preferably, component (D) and component (E) are mixed together either all at once or in multiple stages beforehand using a conventional mixing device. Some of component (E) may be hydrolyzed or form a polymer on the surface of component (D) as described in Patent Document 1 and Patent Document 2. This is included under the concept of surface treatment in the present invention. Either form may be used, but, from the standpoint of the technical effects of the present invention, some or all of component (D) is preferably treated with component (E) before component (F).

The surface treatment method with component (E) and component (F) in the present invention is preferably the direct treatment method and more preferably a surface treatment method with heat in which component (D) is mixed with component (E) and component (F) and heated (base heat). Specifically, after uniformly mixing component (D) or some of component (D) with component (E) and, optionally, with some of primary components (A) or (B), component (F) and the remaining component (D) can be stirred into the mixture under heat at 100 to 200° C. and preferably under reduced pressure. The temperature conditions and stirring time can be set based on the amount of sample used, but is preferably 120 to 180° C. and 0.25 to 10 hours.

In the present invention, as proposed, for example, in Patent Document 3, the thermally conductive filler in component (D) may be surface-treated with two or more kinds of treating agents having different molecular weights serving as component (E). At this time, component (D) may be surface treated by adding the treating agent with the high molecular weight followed by the treating agent with the low molecular weight. By selecting component (E1), good fluidity and gap filling properties can be realized in a one-step surface treatment instead of a multiple-step surface treatment. This is advantageous from a processing standpoint. Even here, component (F) is preferably added after component (E1).

There are no particular restrictions on the mixing device, which can be a single-shaft or twin-shaft continuous mixer, a two-roll mixer, a Ross mixer, a Hobart mixer, a dental mixer, a planetary mixer, a kneader mixer, or a Henschel mixer.

[Component (G)]

A composition of the present invention includes components (A) to (F) and optionally another crosslinking agent and a hydrosilylation reaction inhibitor in liquid (I) and liquid (II). From the standpoint of improving the heat resistance of the heat-conductive silicone gel composition after mixing and the cured product thereof, the present invention preferably also contains (G) a heat resistance imparting agent. Component (G) may be blended with liquid (I) or liquid (II). When the present composition includes three or more components, it may be added as an independent component. There are no particular restrictions on component (G) as long as it can impart heat resistances to a composition of the present invention and cured product thereof. Examples include metal oxides such as iron oxide, titanium oxide, cerium oxide, magnesium oxide, and zinc oxide, metal hydroxides such as cerium hydroxide, phthalocyanine compounds, cerium silanolate, cerium fatty acid salts, and reaction products of organopolysiloxanes with carboxylate salts of cerium. Especially preferred is a phthalocyanine compound. Examples include the additives selected from the group consisting of metal-free phthalocyanine compounds and metal-containing phthalocyanine compounds disclosed in JP 2014-503680 A. Among the metal-containing phthalocyanine compounds, copper phthalocyanine compounds are especially preferred. An example of a most suitable and non-limiting heat-resistance imparting agent is 29H,31H-phthalocyaninato (2-)-N29, N30, N31, N32 copper. These phthalocyanine compounds are available commercially, such as Stan-Tone™ 40SP03 from PolyOne Corporation (Avon Lake, Ohio, USA).

The amount of component (G) may be in a range from 0.01 to 5.0% by mass, from 0.05 to 0.2% by mass, and from 0.07 to 0.1% by mass of the composition as a whole.

[Other Additives]

In addition to the components mentioned above, a thermally conductive silicone gel composition of the present invention may contain optional components as long as the object of the present invention is not impaired. Examples of optional components include organopolysiloxane not containing silicon-bonded hydrogen atoms and silicon-bonded alkenyl groups, cold resistance-imparting agents, flame retardants, pigments, and dyes. If desired, a thermally conductive silicone gel composition can also contain adhesion-imparting agents, one or more antistatic agents such as cationic surfactants, anionic surfactants, or nonionic surfactant; dielectric fillers; electrically conductive fillers; releasable components; thixotropy-imparting agents; and fungicide common in the art. If desired, an organic solvent may also be added. These additives may be blended into either liquid (I) or liquid (II). When the present composition is designed to have three or more components, they may be added as independent components.

[Manufacturing Method for the Composition]

A thermally conductive silicone gel composition of the present invention can be prepared by mixing together the components mentioned above. For example, liquid (I) can be prepared by mixing together component (A), component (D), component (E) and component (F) beforehand, surface-treating component (D) with component (E) and component (F), and then adding component (C), component (G) as needed, and optionally other components. From the standpoint of the technical effects of the present invention, some or all of component (D) is treated with component (E) before being treated with component (F).

Liquid (II) can be prepared by mixing together component (D), component (E) and component (F), surface-treating component (D) with component (E) and component (F), and then adding component (B), component (G) as needed, and optionally other components. In order to make it easier to mix in optional component (G) and a hydrosilylation reaction inhibitor, component (A) is preferably blended with them in the form of a master batch, which is blended after previously mixing in component (A). This may then be used as a component in liquid (II).

Any mixing method common in the art can be used without restriction. However, use of a mixing device is preferred because a uniform mixture can be obtained by simple stirring. There are no particular restrictions on the mixing device, which can be a single-shaft or twin-shaft continuous mixer, a two-roll mixer, a Ross mixer, a Hobart mixer, a dental mixer, a planetary mixer, a kneader mixer, or a Henschel mixer.

[Form and Packaging of the Composition]

A thermally conductive silicone gel composition of the present invention is a multi-component (multiple-part, especially two-part) curable composition in which separate components are mixed together at the time of use. Separately stored compositions can be mixed together at a predetermined ratio and then used. The packaging can be selected as desired based on the curing method, application means, and target object described below, and is not subject to any particular restriction.

[Curability]

A thermally conductive silicone gel composition of the present invention is cured with a hydrosilylation reaction to form a cured silicone gel with excellent thermal conductivity. There are no particular restrictions on the temperature conditions for curing the hydrosilylation-curable silicone gel composition, but is usually in a range from 20° C. to 150° C. and is preferably in a range from 20 to 80° C. If desired, the composition may be cured at a high temperature for a short period time, or may be cured at a low temperature such as room temperature for a long period time (for example, several hours to several days). There are no particular restrictions.

The hardness of a silicone gel cured product of the present invention is preferably in a range from 2 to 70, and more preferably in a range from 2 to 50 when measured using a type E hardness meter in accordance with JIS K6249. A silicone gel cured product with a hardness in this range has the characteristics of a silicone gel, namely, a low elastic modulus and low stress. When the hardness is greater than 70, the adhesion to a heat-generating member is excellent but conformability may be poor. When the hardness is less than 2, conformability is excellent but adherence to a heat-generating member may be poor.

[Thermal Conductivity]

A thermally conductive silicone gel composition of the present invention can be filled stably with a thermally conductive filler, and has thermal conductivity of 2.0 W/mK or more, preferably 3.5 W/mK or more, more preferably 4.0 W/mK or more, and even more preferably 5.0 W/mK. With a thermally conductive silicone gel composition of the present invention, a silicone gel composition and cured product with thermal conductivity 4.0 to 7.0 W/mK can be designed, and the gap filling properties mentioned above can be realized.

[Applications and Heat-Dissipating Structures]

In order to cool heat-generating components by thermal conduction, a thermally conductive silicone gel composition of the present invention is useful as a heat-transferring material (thermally conductive member) interposed at the interface between the heat interface of the heat-generating component and a heat-radiating member such as a heat sink or a circuit board, and a heat-dissipating structure containing this composition can be formed. There are no particular restrictions on the type, size, and fine structure of the heat-generating component. However, because a thermally conductive silicone gel composition of the present invention has excellent gap filling properties on members while maintaining high thermal conductivity, has good adherence and conformability to heat-generating members having fine uneven surfaces and narrow gap structures, and has the flexibility characteristic of gels, it is ideally suited for use in a heat-dissipating structure for an electrical or electronic component or an electrical or electronic device such as a cell-type secondary cell.

There are no particular restrictions on the configuration of the heat-dissipating structure. In one example, a heat-dissipating structure is obtained by providing a heat-dissipating member via a multicomponent curable thermally conductive silicone gel composition or a cured product thereof on a heat-dissipating component or a circuit board including a mounted heat-dissipating component. In this structure, a heat-dissipating component such as an electronic component is mounted on a circuit board, and heat generated by the electronic component is dissipated by a heat dissipating member via a thin-film layer of a multicomponent curable thermally conductive silicone gel composition or a cured product thereof. These members may be arranged horizontally, and a thin-film of multicomponent curable thermally conductive silicone gel composition or cured product thereof may be held vertically between the circuit board and heat-dissipating means. Circuits and electronic components on a circuit board may be connected electrically and a hole may be formed in the circuit board to more efficiently transfer the heat generated by the electronic components.

In this heat-dissipating structure, a thermally conductive silicone gel composition or cured product thereof is held vertically between the circuit board and the heat-dissipating member. There are no particular restrictions on the thickness, but it does not fall out at a thickness in a range from 0.1 to 2 mm, the composition can fill the space without leaving gaps, and heat generated by electronic components can be efficiently transmitted to the heat dissipating member.

There are no particular restrictions on electrical and electronic devices equipped with a member made of the thermally conductive silicone composition. Examples include secondary batteries such as a cell-type lithium ion electrode secondary batteries and cell stack-type fuel cells; electronic circuit boards such as printed circuit boards; IC chips packaged with optical semiconductor devices such as diodes (LEDs), organic electric field devices (organic ELs), laser diodes, and LED arrays; CPUs used in electronic devices such as personal computers, digital video discs, mobile phones, and smartphones; and LSI chips such as driver ICs and memory. In highly integrated, high-performance digital switching circuits, heat removal (radiation) is a major factor in the performance and reliability of integrated circuits. Even when a thermally conductive member using a thermally conductive silicone gel composition of the present invention is applied to power semiconductor applications such as engine control and power train system control in transportation machinery and air conditioner control, the heat-dissipating properties and handling efficiency are excellent. Even when used in a harsh environment incorporated into onboard electronic components such as electronic control units (ECU), the heat resistance and thermal conductivity are excellent.

By controlling the rheology of a thermally conductive silicone gel composition of the present invention, the composition can be suitably arranged not only on a horizontal plane but also on an inclined plane or a vertical plane, and can penetrate into the microstructure of a heat-generating component such as an electrical component, electronic component, or secondary battery to provide a heat-dissipating structure without gaps. In this way, it is less likely to come out when left vertically in a severe temperature environment, and can be used as a heat-dissipating member and a protective material for a control unit in an automobile.

The dissipation of heat from electrical and electronic devices with a heat-dissipating structure is improved, problems associated with latent heat and overheating are reduced, some of the structure of electrical and electronic equipment is protected by the flexible gel-like cured product, and reliability and operation stability are improved.

Examples of materials constituting electrical and electronic devices include resins, ceramics, glass, and metals such as aluminum. A thermally conductive silicone gel composition of the present invention can be used on these materials whether in the form of a (fluid) thermally conductive silicone gel composition prior to curing, or as a thermally conductive silicone cured product.

[Curing Method]

There are no particular restrictions on the method used to form a heat-dissipating structure for a heat-generating component using a heat-conductive silicone gel composition of the present invention. For example, a thermally conductive silicone gel composition of the present invention can be poured onto the heat-dissipating portion of an electrical or electronic component to sufficiently fill gaps, and then heated or allowed to stand at room temperature to cure it.

In applications requiring rapid curing, a method in which heat is applied to cure the entire composition relatively quickly is preferred. As the heating temperature increases, bubbles and cracks are more likely to occur in the sealing agent used to seal and fill gaps in electrical and electronic components. Therefore, heating is preferably conducted in a range from 50 to 250° C. and more preferably in a range from 70 to 130° C. From the standpoint of handling and workability, use of a granular platinum-containing hydrosilylation reaction catalyst dispersed or encapsulated in a thermoplastic resin is preferred during heat curing.

A thermally conductive silicone gel composition of the present invention can also be cured at room temperature or by heating at 50° C. or less. In this case, it is preferably cured after mixing for one hour to several days at room temperature or by heating at 50° C. or less.

The shape, thickness, and arrangement of the cured thermally conductive silicone gel can be selected as desired. The composition can be cured as necessary after the gaps in an electrical or electronic device have been filled, or applied on film provided with a release layer (separator), cured, and simply handled as a thermally conductive silicone gel cured product on film. In this case, the thermally conductive sheet may be reinforced using any reinforcing material common in the art.

[Specific Examples of Electrical and Electronic Devices]

Because a thermally conductive silicone gel composition of the present invention can be used to form a gel-like thermally conductive member with excellent gap filling properties, flexibility, and thermal conductivity, it is effective in electrical and electronic components with narrow gaps between electrodes, between electrical elements, between electronic elements, and between electrical elements and packages, and in structures that are difficult for silicone gels to conform to due to expansion and contraction. It can be used in semiconductor devices such as ICs, hybrid ICs and LSIs, electrical circuits and modules on which electrical elements such as semiconductor elements, capacitors and electric resistors have been mounted, sensors such as pressure sensors, igniters and regulators for automobiles, and power devices for power generating systems and space transportation systems.

EXAMPLES

The following is a more detailed description of the present invention with reference to examples. The present invention is not limited to these examples. In the examples, the compounds and compositions listed below were used as raw materials.

Components (A)-(G) were mixed together at the number of parts shown in Tables 1-2 using the methods indicated in each example and comparative example to obtain the multicomponent thermally conductive silicone gel compositions in Examples 1-2 and Comparative Examples 1-2 consisting of liquid (I) and liquid (II). Preparation of Comparative Example 3 was also attempted.

[Preparation of the Thermally Conductive Silicone Gel Cured Products]

A 15 mm high×100 mm long×50 mm wide frame was prepared using a polyethylene backer on a polypropylene sheet, the frame was filled with a composition obtained by uniformly mixing together liquid (I) and liquid (II) obtained in each example and comparative example, a Teflon (registered trademark) sheet was pressed down on top to make the surface smooth, and curing was performed at 25° C. for one day. After curing, the Teflon (registered trademark) sheet and polyethylene backer were removed to obtain a thermally conductive silicone gel cured product. The thermally conductive silicone gel compositions obtained with the number of parts shown in Examples 1-2 and Comparative Examples 1-2 contained enough component (D) to obtain thermal conductivity of 5.0 W/mK. The thermal conductivity was measured with the probe method using QTM-500 from Kyoto Electronics.

Tests were performed to determine the effects of the present invention. The viscosity, hardness, and storage stability of the thermally conductive silicone compositions were measured as follows.

[Viscosity]

The viscosity (Pa·s) at 25° C. of the thermally conductive silicone compositions was measured using a rheometer (AR550) from TA Instruments. The geometry was measured using a parallel plate with a diameter of 20 mm after 120 seconds with gap of 200 μm and shear rates of 1.0 and 10.0 (1/s).

[Hardness]

The hardness of the thermally conductive silicone cured product obtained under conditions described above was measured using an ASKER TYPE E hardness tester from ASKER.

[Storage Stability]

The thermally conductive silicone compositions were separated into liquid (I) and liquid (II), and 2.5 kg of each was placed in a 1.1 L ointment bottle and stored at room temperature. After one month, liquid (I) and liquid (II) were checked for the presence or absence of oil separation.

The compositions of the present invention were formed using the following components.

Component (A):

A-1: Dimethylpolysiloxane capped at both ends of the molecular chain with a dimethylvinylsiloxy group (viscosity 60 mPa·s, Vi content 1.52% by mass)

A-2: Dimethylpolysiloxane capped at both ends of the molecular chain with a dimethylvinylsiloxy group (viscosity 400 mPa·s, Vi content 0.43% by mass)

Component (B):

B-1: A methyl hydrogen siloxane/dimethyl siloxane copolymer capped at both ends of the molecular chain with a trimethylsiloxy group, 2 on average in the molecule and 2 on a side chain of the molecular chain (viscosity 20 mPa·s, Si—H content 0.10% by mass)

Non-B-2: A methyl hydrogen siloxane/dimethyl siloxane copolymer capped at both ends of the molecular chain with a trimethylsiloxy group, 5 on average in the molecule and 5 on a side chain of the molecular chain (viscosity 5 mPa·s, Si—H content 0.75% by mass)

Non-B-3: A methyl hydrogen siloxane/dimethyl siloxane copolymer capped at both ends of the molecular chain with a dimethylhydroxy group, 3 on average in the molecule and 1 on a side chain of the molecular chain (viscosity 20 mPa·s, Si—H content 0.14% by mass)

Component (C):

C-1: Complex of platinum and 1,3-divinyl-1,1,3,3-tetramethyldisiloxane with a platinum concentration of 0.6% by weight Component (D):

D-1: Crushed aluminum oxide powder with an average particle size of 0.4 μm

D-2: Crushed aluminum oxide powder with an average particle size of 2.5 μm

D-3: Spherical aluminum oxide powder with an average particle diameter of 35 μm

Component (E):

E-1: Decyltrimethoxysilane

Compound (F):

F-1: A polyorganosiloxane represented by the following formula

[Formula 4]

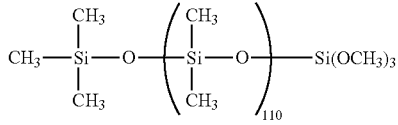

Component (G):

G-1: 29H,31H-phthalocyaninato (2-)-N29, N30, N31, N32 copper

G-2: Iron oxide

Example 1

First, 92.2 parts by mass of component (A-1), 13.8 parts by mass of component (E-1), and 23 parts by mass of component (F-1) were weighed out, and then 461 parts by mass of component (D-1), 461 parts by mass of component (D-2), and 1,244 parts by mass of component (D-3) were successively mixed in over 30 minutes. Once uniform, the mixture was heated and mixed at 160° C. for 60 minutes under reduced pressure, and then cooled to room temperature to obtain a mixture. Then, 0.263 parts by mass of component (C-1) and 7.8 parts by mass of component (A-2) for uniform mixing were mixed into the mixture to obtain liquid (I) of a thermally conductive silicone composition. Next, 95.6 parts by mass of component (F-1) and 13.8 parts by mass of component (E-1) were weighed out, and then 461 parts by mass of component (D-1), 461 parts by mass of component (D-2), and 1,244 parts by mass of component (D-3) were successively mixed in over 30 minutes. Once uniform, the mixture was heated and mixed at 160° C. for 60 minutes under reduced pressure, and then cooled to room temperature to obtain a mixture. Then, 18.66 parts by mass of component (B-1), 0.46 parts by mass of component (Non-B-2), 2.76 parts by mass of component (G-1), and 0.014 parts by mass of phenylbutynol serving as a reaction inhibitor were uniformly mixed into the mixture to obtain liquid (II) of the thermally conductive silicone composition. The viscosity of the thermally conductive silicone composition was measured with a rheometer (AR550) from TA Instruments. Also, the composition was cured at 25° C. for 1 day, and the hardness was measured. One month later, the storage stability was checked. The results are shown in Table 1.

Example 2

First, 87.3 parts by mass of component (A-1), 9.4 parts by mass of component (E-1), and 23.6 parts by mass of component (F-1) were weighed out, and then 354 parts by mass of component (D-1), 354 parts by mass of component (D-2), and 1,509 parts by mass of component (D-3) were successively mixed in over 30 minutes. Once uniform, the mixture was heated and mixed at 160° C. for 60 minutes under reduced pressure, and then cooled to room temperature to obtain a mixture. Then, 0.269 parts by mass of component (C-1) and 12.7 parts by mass of component (A-2) for uniform mixing were mixed into the mixture to obtain liquid (I) of a thermally conductive silicone composition. Next, 94.3 parts by mass of component (F-1) and 9.4 parts by mass of component (E-1) were weighed out, and then 354 parts by mass of component (D-1), 354 parts by mass of component (D-2), and 1,509 parts by mass of component (D-3) were successively mixed in over 30 minutes. Once uniform, the mixture was heated and mixed at 160° C. for 60 minutes under reduced pressure, and then cooled to room temperature to obtain a mixture. Then, 34.9 parts by mass of component (B-1) and 0.014 parts by mass of phenylbutynol serving as a reaction inhibitor were uniformly mixed into the mixture to obtain liquid (II) of the thermally conductive silicone composition. The viscosity of the thermally conductive silicone composition was measured with a rheometer (AR550) from TA Instruments. Also, the composition was cured at 25° C. for 1 day, and the hardness was measured. One month later, the storage stability was checked. The results are shown in Table

TABLE 1

| Component | Example 1 | | Example 2 | |
| --- | --- | --- | --- | --- |
| | Liquid (I) | Liquid (II) | Liquid (I) | Liquid (II) |
| A-1 | 92.2 | — | 87.3 | — |
| A-2 | 7.8 | — | 12.7 | — |
| B-1 | — | 18.66 | — | 34.9 |
| Non-B-2 | — | 0.46 | — | — |
| C-1 | 0.263 | — | 0.269 | — |
| D-1 | 461 | 461 | 354 | 354 |
| D-2 | 461 | 461 | 354 | 354 |
| D-3 | 1244 | 1244 | 1509 | 1509 |
| E-1 | 13.8 | 13.8 | 9.4 | 9.4 |
| F-1 | 23.0 | 95.6 | 23.6 | 94.3 |
| G-1 | — | 2.76 | — | — |
| G-2 | — | — | 3.54 | — |
| Phenylbutynol | — | 0.014 | — | 0.014 |
| Si—H/Alkenyl Group Mol Ratio | 0.46 | | 0.69 | |
| $[H_{non-B1}]/[H_{B1}] + [H_{non-B1}]$ | 0.16 | | 0.0 | |

TABLE 1-continued

| Component | Example 1 | | Example 2 | |
|---|---|---|---|---|
| | Liquid (I) | Liquid (II) | Liquid (I) | Liquid (II) |
| [(II)[E-1] + [F-1]]/ [(I)[E-1] + [F-1]] | 3.0 | | 3.1 | |
| [(II)[F-1]]/[(I)[F-1]] | 4.2 | | 4.0 | |
| [(II)[E-1]]/[(I)[E-1]] | 1.0 | | 1.0 | |
| Type E Hardness | 20 | | 64 | |
| Viscosity 10.0 (1/s) (Pa · s) | 177 | 209 | 118 | 98 |
| Storage Stability | No Separation | No Separation | No Separation | No Separation |

Comparative Example 1

Liquid (I) of a thermally conductive silicone composition was obtained in the same manner as Example 2. Next, 66.0 parts by mass of component (A-1), 9.4 parts by mass of component (E-1) and 18.9 parts by mass of component (F-1) were weighed out, and then 354 parts by mass of component (D-1), 354 parts by mass of component (D-2), and 1,509 parts by mass of component (D-3) were successively mixed in over 30 minutes. Once uniform, the mixture was heated and mixed at 160° C. for 60 minutes under reduced pressure, and then cooled to room temperature to obtain a mixture. The mixture could not be maintained in a uniform paste form. Then, 36.6 parts by mass of component (B-1), 0.71 parts by mass of component (Non-B-2), 2.45 parts by mass of component (G-1), and 0.014 parts by mass of phenylbutynol serving as a reaction inhibitor were mixed into the mixture, but a uniform liquid (II) of the thermally conductive silicone composition could not be obtained. The viscosity of the thermally conductive silicone composition was measured with a rheometer (AR550) from TA Instruments. Also, the composition was cured at 25° C. for 1 day, and the hardness was measured. One month later, the storage stability was checked. The results are shown in Table 2.

Comparative Example 2

Liquid (I) of a thermally conductive silicone composition was obtained in the same manner as Example 2. Next, 82.5 parts by mass of component (A-1), 9.4 parts by mass of component (E-1), and 11.8 parts by mass of component (F-1) were weighed out, and then 354 parts by mass of component (D-1), 354 parts by mass of component (D-2), and 1,509 parts by mass of component (D-3) were successively mixed in over 30 minutes. Once uniform, the mixture was heated and mixed at 160° C. for 60 minutes under reduced pressure, and then cooled to room temperature to obtain a mixture. Then, 0.71 parts by mass of component (Non-B-2), 28.77 parts by mass of component (Non-B-3), 2.17 parts by mass of component (G-1), and 0.014 parts by mass of phenylbutynol serving as a reaction inhibitor were uniformly mixed into the mixture to obtain liquid (II) of the thermally conductive silicone composition. The viscosity of the thermally conductive silicone composition was measured with a rheometer (AR550) from TA Instruments. Also, the composition was cured at 25° C. for 1 day, and the hardness was measured. One month later, the storage stability was checked. The results are shown in Table 2.

TABLE 2

| Component | Comparative Example 1 | | Comparative Example 2 | |
|---|---|---|---|---|
| | Liquid (I) | Liquid (II) | Liquid (I) | Liquid (II) |
| A-1 | 87.3 | 66.0 | 87.3 | 82.5 |
| A-2 | 12.7 | — | 12.7 | — |
| B-1 | — | 36.6 | — | — |
| Non-B-2 | — | 0.71 | — | 0.71 |
| Non-B-3 | — | — | — | 28.77 |
| C-1 | 0.269 | — | 0.269 | — |
| D-1 | 354 | 354 | 354 | 354 |
| D-2 | 354 | 354 | 354 | 354 |
| D-3 | 1509 | 1509 | 1509 | 1509 |
| E-1 | 9.4 | 9.4 | 9.4 | 9.4 |
| F-1 | 23.6 | 18.9 | 23.6 | 11.8 |
| G-1 | — | 2.45 | — | 2.17 |
| G-2 | 3.54 | — | 3.54 | — |
| Phenylbutynol | — | 0.014 | — | 0.014 |
| Si—H/Alkenyl Group Mol Ratio | 0.49 | | 0.47 | |
| $[H_{non-B1}]/[H_{B1}] + H_{non-B1}]$ | 0.13 | | 1.0 | |
| [(II)[E-1] + [F-1]]/ [(I)[E-1] + [F-1]] | 0.86 | | 0.64 | |
| [(II)[F-1]]/[(I)[F-1]] | 0.80 | | 0.50 | |
| [(II)[E-1]]/[(I)[E-1]] | 1.0 | | 1.0 | |
| Type E Hardness | Unmeasurable | | 6 | |
| Viscosity 10.0 (1/s) (Pa · s) | 118 | Not Uniform | 118 | 129 |
| Storage Stability | No Separation | Not Uniform | No Separation | No Separation |

Comparative Example 3

Liquid (I) of a thermally conductive silicone composition was obtained in the same manner as Example 1. Next, 23 parts by mass of component (F-1) (=same amount as in liquid (I) of Example 1) and 13.8 parts by mass of component (E-1) were weighed out, and when 461 parts by mass of component (D-1), 461 parts by mass of component (D-2), and 1,244 parts by mass of component (D-3) were successively mixed in over 30 minutes, a solid power composition was obtained instead of a liquid composition. In other words, liquid (II) could not be prepared.

When the mass ratio of the sum of component (E) and component (F) in liquid (II) to the sum of component (E) and component (F) in liquid (I) was 3.0 or 3.1 as in Examples 1-2, each thermal conductive silicone gel composition of the present invention (designed thermal conductivity: 5.0 W/mK) maintained a viscosity in liquids (I) and (II) before curing indicating excellent gap filling properties, and no oil separation was observed when the storage stability was checked after one month. In other words, good storage stability was obtained.

In Comparative Example 1, a thermally conductive silicone gel composition could not be obtained in the form of a uniform paste. In Comparative Example 2, a thermally conductive silicone gel composition could be obtained in the form of a uniform paste, but a large amount of oil separation was observed when the storage stability was checked after one month. In other words, storage stability was insufficient. In Comparative Example 3, the components corresponding to liquid (II) were not in liquid form, and a multicomponent curable thermally conductive silicone gel composition could not be obtained. Therefore, when the mass ratio of the sum of component (E) and component (F) in liquid (II) to the sum of component (E) and component (F) in liquid (I) was not within the scope of the present patent, a stable multicomponent curable thermally conductive silicone gel composition could not be obtained.

The invention claimed is:
1. A multicomponent curable thermally conductive silicone gel composition comprising:
(A) an alkenyl group-containing organopolysiloxane having a viscosity at 25° C. of 10 to 100,000 mPa s in an amount of 100 parts by mass;
(B) an organohydrogenpolysiloxane in an amount such that the silicon-bonded hydrogen atoms in component (B) are from 0.2 to 5 mol per mol of alkenyl groups in component (A);
(C) a hydrosilylation reaction catalyst in a catalytic amount;
(D) a thermally conductive filler;
(E) one or more silane coupling agents or hydrolyzed condensates thereof; and
(F) an organopolysiloxane having a hydrolyzable silyl group at one end of the molecular chain;
wherein at least liquids (I) and (II) below are stored separately;
(I): a liquid composition containing components (A), (C), (D), (E) and (F), but not component (B), and
(II): a liquid composition containing components (B), (D), (E) and (F), but not component (C); and
wherein
the amount of component (D) in liquid (I) is from 600 to 3,500 parts by mass,
the amount of component (D) in liquid (II) is from 600 to 3,500 parts by mass, and
the mass ratio of the sum of component (E) and component (F) in liquid (II) to the sum of component (E) and component (F) in liquid (I) is in a range from 1.5 to 10.0.

2. The multicomponent curable thermally conductive silicone gel composition according to claim 1, wherein the total amount of component (E) and component (F) is 0.1 to 5.0% by mass and the mass ratio of component (E) to component (F) is in a range from 5:95 to 95:5 when the total mass of component (D) in the composition is 100% by mass.

3. The multicomponent curable thermally conductive silicone gel composition according to claim 1, wherein the thermal conductivity is at least 2.0 W/mK.

4. The multicomponent curable thermally conductive silicone gel composition according to claim 1, wherein component (E) comprises (E1) an alkoxysilane having an alkyl group with 6 or more carbon atoms in the molecule, and component (D) is surface-treated with component (E) and component (F).

5. The multicomponent curable thermally conductive silicone gel composition according to claim 1, wherein component (F) is an organopolysiloxane represented by general formula (1) below, general formula (2) below, or a mixture of these;
(i) organopolysiloxanes having a viscosity at 25° C. of from 10 to less than 10,000 mPa s represented by general formula (1):

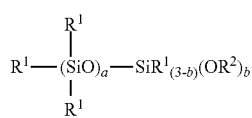

where $R^1$ represents an unsubstituted or substituted monovalent hydrocarbon group, each $R^2$ independently represents a hydrogen atom, an alkyl group, an alkoxyalkyl group, or an acyl group, a is an integer from 5 to 250, and b is an integer from 1 to 3;
(ii) organopolysiloxanes represented by general formula (2):

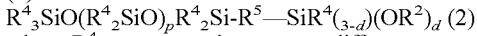

where $R^4$ represents the same or different monovalent hydrocarbon group, $R^5$ is an oxygen atom or a divalent hydrocarbon group, $R^2$ is the same as above, p is an integer from 100 to 500, and d is the same as above.

6. The multicomponent curable thermally conductive silicone gel composition according to claim 1, wherein the mass ratio of component (F) in liquid (II) to component (F) in liquid (I) is in a range from 1.5 to 10.0.

7. The multicomponent curable thermally conductive silicone gel composition according to claim 1, wherein the amount of component (D) in liquids (I) and (II) is in a range from 85 to 98% by mass relative to the composition as a whole, and the composition is substantially free of fillers other than component (D).

8. The multicomponent curable thermally conductive silicone gel composition according to claim 1, wherein component (B) comprises component (B1) and component (B1) has a viscosity at 25° C. of from 1 to 1,000 mPa s and contains an average of 2 to 4 silicon-bonded hydrogen atoms per molecule, some being linear organohydrogenpolysiloxanes having at least 2 such atoms on a side chain of the molecular chain, and a relationship is established between the silicon-bonded hydrogen atoms $[H_{B1}]$ in component (B1) of the composition and the silicon-bonded hydrogen atoms in organohydrogenpolysiloxanes other than component (B1) $[H_{non-B1}]$ such that the value of $[H_{non-B1}]/([H_{B1}+[H_{non-B1}])$ is in a range of from 0.0 to 0.70.

9. The multicomponent curable thermally conductive silicone gel composition according to claim 1, further comprising (G) a heat resistance-imparting agent.

10. The multicomponent curable thermally conductive silicone gel composition according to claim 1, wherein component (D) is (D1) a tabular boron nitride powder having an average particle size of 0.1 to 30 μm, (D2) a granular boron nitride powder having an average particle size of 0.1 to 50 μm, (D3) a spherical and/or crushed aluminum oxide powder having an average particle size of 0.01 to 50 μm, (D4) graphite having an average particle size of 0.01 to 50 μm, or a mixture of two or more of these.

11. The multicomponent curable thermally conductive silicone gel composition according to claim 1, wherein the multicomponent curable thermally conductive silicone gel composition is a two-component thermally conductive silicone gel composition comprising liquid (I) and liquid (II).

12. A thermally conductive member comprising the multicomponent curable thermally conductive silicone gel composition according to claim 1 or a cured product thereof.

13. A heat-dissipating structure comprising the thermally conductive member according to claim 12.

14. The heat-dissipating structure according to claim 13, wherein the heat-dissipating structure is an electrical device or electronic device.

15. The heat-dissipating structure according to claim 13, wherein the heat-dissipating structure is an electrical device, an electronic device, or a secondary battery.

16. A heat-dissipating structure obtained by providing a heat-dissipating member via the multicomponent curable thermally conductive silicone gel composition according to claim 1 or a cured product thereof on a heat-dissipating component or a circuit board including a mounted heat-dissipating component.

\* \* \* \* \*